(12) United States Patent
Matsudai et al.

(10) Patent No.: US 9,613,951 B2
(45) Date of Patent: Apr. 4, 2017

(54) SEMICONDUCTOR DEVICE WITH DIODE

(71) Applicant: Kabushiki Kaisha Toshiba, Minato-ku, Tokyo (JP)

(72) Inventors: Tomoko Matsudai, Tokyo (JP); Tsuneo Ogura, Kanagawa-ken (JP); Yuuichi Oshino, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/199,332

(22) Filed: Mar. 6, 2014

(65) Prior Publication Data

US 2014/0284658 A1 Sep. 25, 2014

(30) Foreign Application Priority Data

Mar. 25, 2013 (JP) ................................ 2013-062969

(51) Int. Cl.
*H01L 27/07* (2006.01)
*H01L 29/40* (2006.01)
(Continued)

(52) U.S. Cl.
CPC ...... *H01L 27/0716* (2013.01); *H01L 29/0619* (2013.01); *H01L 29/0649* (2013.01);
(Continued)

(58) Field of Classification Search
CPC ............. H01L 29/1095; H01L 29/7395; H01L 29/7813; H01L 29/0619; H01L 29/0696;
(Continued)

(56) References Cited

U.S. PATENT DOCUMENTS 4,445,218 A * 4/1984 Coldren ..................... 372/44.01
5,101,244 A 3/1992 Mori et al.
(Continued)

FOREIGN PATENT DOCUMENTS

EP 0 077 004 A2 4/1983
JP H03-250670 A 11/1991
(Continued)

OTHER PUBLICATIONS

Japanese Office Action issued on May 13, 2015 in corresponding Japanese Application No. 2013-062969, along with English translation thereof.
(Continued)

*Primary Examiner* — John P Dulka
*Assistant Examiner* — Charles R Peters
(74) *Attorney, Agent, or Firm* — White & Case LLP

(57) ABSTRACT

According to one embodiment, a semiconductor device includes a first and second electrode, a first, second, third and fourth semiconductor region, and a first intermediate metal film. The first region is provided above the first electrode and has a first impurity concentration. The second region is provided above the first region and has a second impurity concentration lower than the first impurity concentration. The third region is provided above the second region and has a third impurity concentration. The fourth region is provided above the second region and has a fourth impurity concentration lower than the third impurity concentration. The second electrode is provided above the third region and the fourth region and is in ohmic contact with the third region. The intermediate metal film is provided between the second electrode and the fourth region. The intermediate metal film forms Schottky junction with the fourth region.

6 Claims, 13 Drawing Sheets

(51) Int. Cl.
  *H01L 29/66* (2006.01)
  *H01L 29/861* (2006.01)
  *H01L 29/872* (2006.01)
  *H01L 29/06* (2006.01)
  *H01L 29/36* (2006.01)
  *H01L 29/16* (2006.01)
  *H01L 29/22* (2006.01)

(52) U.S. Cl.
  CPC ...... *H01L 29/407* (2013.01); *H01L 29/66143* (2013.01); *H01L 29/861* (2013.01); *H01L 29/872* (2013.01); *H01L 29/1602* (2013.01); *H01L 29/1608* (2013.01); *H01L 29/2203* (2013.01); *H01L 29/36* (2013.01)

(58) Field of Classification Search
  CPC ........... H01L 29/66734; H01L 29/7397; H01L 29/1608; H01L 29/4236; H01L 29/66333; H01L 29/66348; H01L 29/7816; H01L 29/0634; H01L 27/0716; H01L 29/861; H01L 29/872; H01L 29/407; H01L 29/0649; H01L 29/66143; H01L 29/36; H01L 29/2203; H01L 29/1602
  See application file for complete search history.

(56) References Cited

U.S. PATENT DOCUMENTS

| | | | |
|---|---|---|---|
| 5,608,244 A * | 3/1997 | Takahashi | 257/267 |
| 6,501,146 B1 | 12/2002 | Harada | |
| 6,979,874 B2 | 12/2005 | Harada | |
| 2006/0035422 A1 * | 2/2006 | He | H01L 27/0629 438/167 |
| 2009/0160008 A1 | 6/2009 | Fujiwara et al. | |
| 2011/0037139 A1 * | 2/2011 | Zhao | H01L 21/0495 257/471 |
| 2012/0032313 A1 | 2/2012 | Yamamoto et al. | |
| 2012/0061726 A1 | 3/2012 | Tokura et al. | |
| 2014/0070266 A1 | 3/2014 | Matsudai et al. | |
| 2015/0115285 A1 * | 4/2015 | Kinoshita | H01L 29/872 257/77 |

FOREIGN PATENT DOCUMENTS

| | | |
|---|---|---|
| JP | H03-250679 A | 11/1991 |
| JP | 07-86621 A | 3/1995 |
| JP | H07-106605 A | 4/1995 |
| JP | H11-8399 A | 1/1999 |
| JP | H11-97715 A | 4/1999 |
| JP | 2005-333147 A | 12/2005 |
| JP | 2007-324218 A | 12/2007 |
| JP | 2008-047565 A | 2/2008 |

OTHER PUBLICATIONS

Chinese Office Action issued on Jun. 1, 2016 in corresponding Chinese Application No. 201310722167.4, along with English translation thereof.

* cited by examiner

SEMICONDUCTOR DEVICE WITH DIODE

CROSS-REFERENCE TO RELATED APPLICATIONS

This application is based upon and claims the benefit of priority from Japanese Patent Application No. 2013-062969, filed on Mar. 25, 2013; the entire contents of which are incorporated herein by reference.

FIELD

Embodiments described herein relate generally to a semiconductor devices.

BACKGROUND

Examples of semiconductor devices include a diode as a device having rectification functionality. For instance, in using an IGBT (insulated gate bipolar transistor) as a power transistor, a diode for backflow is connected antiparallel to the IGBT. In semiconductor devices having rectification functionality such as diodes, there is demand for reducing switching time (extinction time of recovery current at turn-off time) and improving breakdown withstand capability.

DETAILED DESCRIPTION

Figure 1:
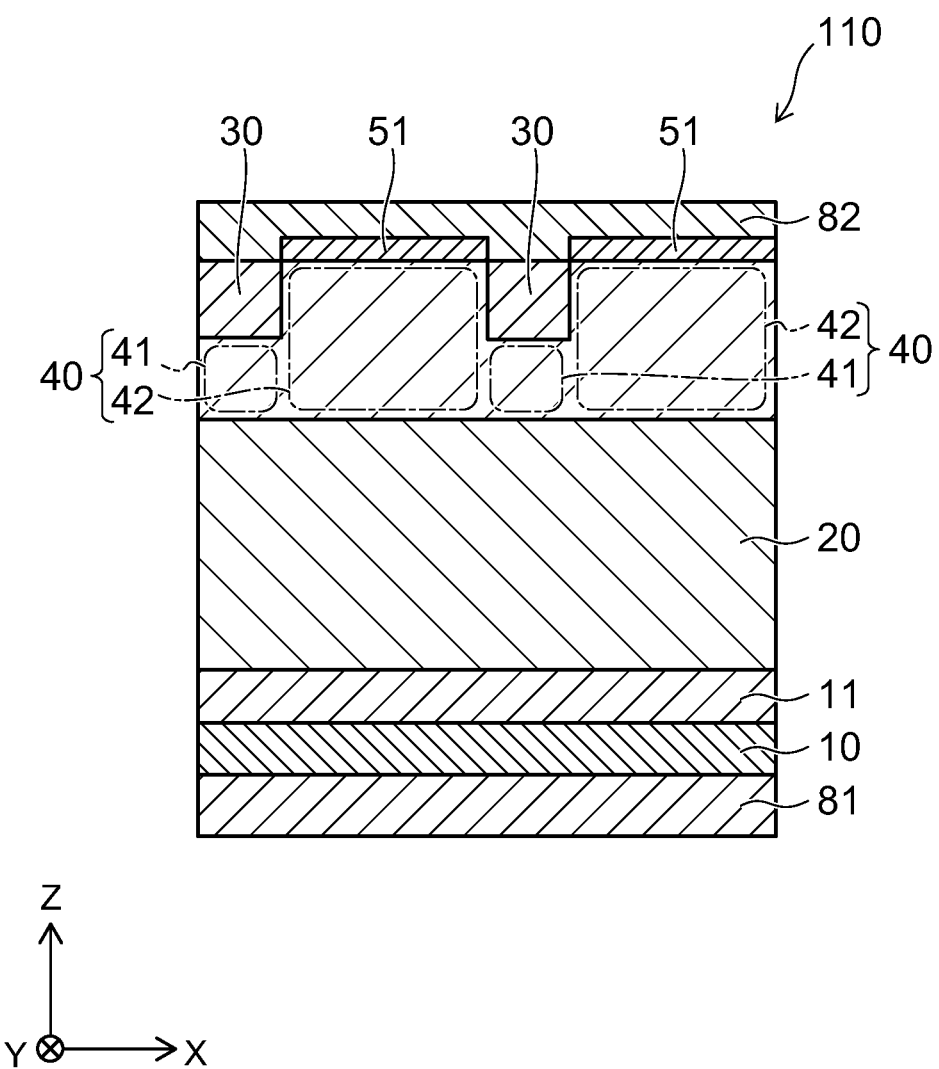
FIG. 1 is a schematic sectional view illustrating a semiconductor device according to a first embodiment.

In general, according to one embodiment, a semiconductor device includes a first electrode, a first semiconductor region, a second semiconductor region, a third semiconductor region, a fourth semiconductor region, a second electrode, and a first intermediate metal film. The first semiconductor region of a first conductivity type is provided above the first electrode and has a first impurity concentration. The second semiconductor region of the first conductivity type is provided above the first semiconductor region and has a second impurity concentration lower than the first impurity concentration. The third semiconductor region of a second conductivity type is provided above the second semiconductor region and has a third impurity concentration. The fourth semiconductor region of the second conductivity type is provided above the second semiconductor region and has a fourth impurity concentration lower than the third impurity concentration. The second electrode is provided above the third semiconductor region and the fourth semiconductor region and is in ohmic contact with the third semiconductor region. The first intermediate metal film is provided between the second electrode and the fourth semiconductor region. The first intermediate metal film forms Schottky junction with the fourth semiconductor region.

Various embodiments will be described hereinafter with reference to the accompanying drawings. In the following description, like members are labeled with like reference numerals, and the description of the members once described is omitted appropriately.

In the following description, the notations of $n^+$, $n$, $n^-$ and $p^+$, $p$, $p^-$ represent relative magnitude of impurity concentration in each conductivity type. That is, $n^+$ represents relatively higher n-type impurity concentration than n, and $n^-$ represents relatively lower n-type impurity concentration than n. Similarly, $p^+$ represents relatively higher p-type impurity concentration than p, and $p^-$ represents relatively lower p-type impurity concentration than p.

In the following description, by way of example, the first conductivity type is n-type, and the second conductivity type is p-type.

(First Embodiment)

FIG. 1 is a schematic sectional view illustrating a semiconductor device according to a first embodiment.

As shown in FIG. 1, the semiconductor device 110 according to the first embodiment includes a cathode electrode 81 as a first electrode, an $n^+$-type cathode layer 10 as a first semiconductor region, an $n^-$-type base layer 20 as a second semiconductor region, a $p^+$-type anode layer 30 as a third semiconductor region, a $p^-$-type anode layer 40 as a fourth semiconductor region, an anode electrode 82 as a second electrode, and a first barrier metal 51 as a first intermediate metal film. The semiconductor device 110 is e.g. a diode.

The cathode electrode 81 is made of e.g. aluminum (Al). The $n^+$-type cathode layer 10 is provided above the cathode electrode 81. Here, the direction connecting the cathode electrode 81 and the $n^+$-type cathode layer 10 is referred to as Z-direction. One of the directions orthogonal to the Z-direction is referred to as X-direction. The direction orthogonal to the Z-direction and the X-direction is referred to as Y-direction.

The $n^+$-type cathode layer 10 is a layer made of a semiconductor (e.g., Si) doped with an n-type impurity (e.g., phosphorus (P), arsenic (As)). The thickness (length in the Z-direction) of the $n^+$-type cathode layer 10 is e.g. 0.05 micrometers (μm) or more and 5 μm or less. The $n^+$-type cathode layer 10 has a first impurity concentration. The first impurity concentration is higher than e.g. $3\times10^{17}$ cm$^{-3}$ in terms of surface concentration, and e.g. $1\times10^{19}$ cm$^{-3}$ or less. The $n^+$-type cathode layer 10 is in ohmic contact with the cathode electrode 81. Here, ohmic contact refers to a contact between two substances, the contact having a characteristic such that the potential difference at the contact surface is proportional to the current passing therethrough.

The n⁻-type base layer 20 is provided above the n⁺-type cathode layer 10. The thickness (length in the Z-direction) of the n⁻-type base layer 20 is designed depending on the breakdown voltage of the device, and is e.g. 10 μm or more and 500 μm or less. The n⁻-type base layer 20 has a second impurity concentration lower than the first impurity concentration. For instance, in the case of a 1200 V device, the thickness of the n⁻-type base layer 20 is 100 μm or more and 200 μm or less, and the concentration of n⁻-type impurity of the n⁻-type base layer 20 is e.g. $2 \times 10^{13}$ cm$^{-3}$ or more and $1 \times 10^{14}$ cm$^{-3}$ or less.

In this embodiment, an n-type buffer layer 11 as a fifth semiconductor region is provided between the n⁺-type cathode layer 10 and the n⁻-type base layer 20. The n⁻-type base layer 20 is provided above the n⁺-type cathode layer 10 via the n-type buffer layer 11. The thickness (length in the Z-direction) of the n-type buffer layer 11 is e.g. 0.1 μm or more and 30 μm or less. The n-type buffer layer 11 has a fifth impurity concentration lower than the first impurity concentration and higher than the second impurity concentration. The fifth impurity concentration is e.g. $1 \times 10^{12}$ cm$^{-3}$ or more and $5 \times 10^{12}$ cm$^{-3}$ or less.

The p⁺-type anode layer 30 is provided above the n⁻-type base layer 20. The p⁺-type anode layer 30 is provided partly above the n⁻-type base layer 20. The p⁺-type anode layer 30 is provided like e.g. a line extending in the Y-direction. The p⁺-type anode layer 30 may be provided in a plurality. Alternatively, the p⁺-type anode layer 30 may be provided like an island.

The p⁺-type anode layer 30 contains a p-type impurity (e.g., boron (B), Al). The p⁺-type anode layer 30 has a third impurity concentration. The third impurity concentration is e.g. $3 \times 10^{17}$ cm$^{-3}$ or more and $2 \times 10^{20}$ cm$^{-3}$ or less in terms of surface concentration.

The p⁻-type anode layer 40 is provided above the n⁻-type base layer 20. The p⁻-type anode layer 40 contains a p-type impurity (e.g., B, Al). The p⁻-type anode layer 40 has a fourth impurity concentration lower than the third impurity concentration. The fourth impurity concentration is e.g. $3 \times 10^{17}$ cm$^{-3}$ or less in terms of surface concentration.

The p⁻-type anode layer 40 includes a first portion 41 and a second portion 42. The first portion 41 is provided between the n⁻-type base layer 20 and the p⁺-type anode layer 30. The second portion 42 is provided between the anode electrode 82 and the n⁻-type base layer 20. Part of the second portion 42 above the anode electrode 82 side is juxtaposed with the p⁺-type anode layer 30.

The anode electrode 82 is provided above the p⁺-type anode layer 30 and the p⁻-type anode layer 40. The anode electrode 82 is made of e.g. Al. The anode electrode 82 is in ohmic contact with the p⁺-type anode layer 30.

The first barrier metal 51 is provided between the anode electrode 82 and the p⁻-type anode layer 40. The first barrier metal 51 forms Schottky junction with the p⁻-type anode layer 40. Here, Schottky junction refers to a junction in which a Schottky barrier is formed between a metal and a semiconductor. In this embodiment, Schottky junction includes the state of no ohmic contact.

The first barrier metal 51 is electrically connected to the anode electrode 82. The first barrier metal 51 is made of e.g. titanium (Ti) or tungsten (W). The first barrier metal 51 may be a monolayer film of a metal material, or a multilayer film in which a plurality of metal materials are stacked. The work function of the material of the first barrier metal 51 is larger than the work function of the material of the anode electrode 82.

In the semiconductor device 110, the first barrier metal 51 is provided between the anode electrode 82 and the p⁻-type anode layer 40. Thus, irrespective of the material of the anode electrode 82, a reliable Schottky junction is obtained between the p⁻-type anode layer 40 and the metal (first barrier metal 51) electrically connected to the anode electrode 82.

On the other hand, the first barrier metal 51 is not interposed between the p⁺-type anode layer 30 and the anode electrode 82. Thus, a reliable ohmic contact is obtained between the anode electrode 82 and the p⁺-type anode layer 30. That is, in the semiconductor device 110, even if the impurity concentration (third impurity concentration) of the p⁺-type anode layer 30 is lowered, a sufficient ohmic contact is obtained between the p⁺-type anode layer 30 and the anode electrode 82.

Next, the operation of the semiconductor device 110 is described.

Figure 2A:
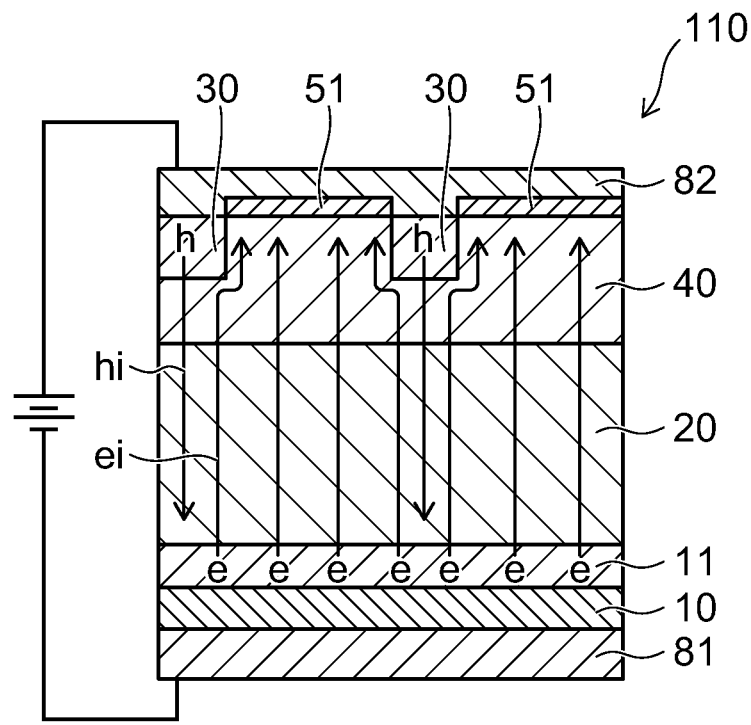
FIG. 2A and FIG. 2B are schematic sectional views describing the operation of the semiconductor device.
Figure 2B:
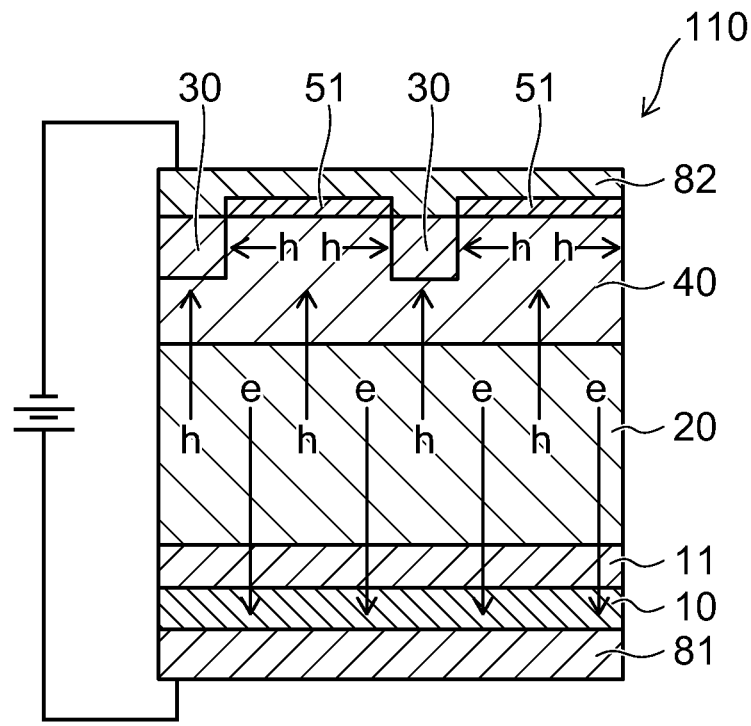

FIGS. 2A and 2B are schematic sectional views describing the operation of the semiconductor device.

FIG. 2A is a schematic sectional view describing the on-state. FIG. 2B is a schematic sectional view describing the off-state.

First, as shown in FIG. 2A, a voltage (forward bias) is applied between the anode and the cathode so that the potential of the anode electrode 82 is higher than the potential of the cathode electrode 81. This turns the semiconductor device 110 to the on-state.

In the semiconductor device 110, the n⁺-type cathode layer 10 is in ohmic contact with the cathode electrode 81. Thus, electrons (e) migrate from the n⁺-type cathode layer 10 through the n⁻-type base layer 20 to the p⁻-type anode layer 40.

The p⁻-type anode layer 40 forms Schottky junction with the anode electrode 82. Thus, between the p⁻-type anode layer 40 and the anode electrode 82, there is an energy barrier for holes (h), but no energy barrier for electrons (e). Accordingly, electrons (e) flow from the n⁺-type cathode layer 10 through the n⁻-type base layer 20 and the p⁻-type anode layer 40 into the anode electrode 82. Thus, an electron current ei is formed between the cathode and the anode.

On the other hand, between the p⁻-type anode layer 40 and the p⁺-type anode layer 30, there is an energy barrier for electrons (e). Thus, the electrons (e) having flowed into the p⁻-type anode layer 40 do not easily flow into the p⁺-type anode layer 30. The electrons (e) directed to the p⁺-type anode layer 30 migrate in the lateral direction (direction along the XY-plane) near the p⁺-type anode layer 30. By this migration of electrons (e), the portion below the p⁺-type anode layer 30 is negatively biased relative to the anode electrode 82.

By this bias, below the p⁺-type anode layer 30, the energy barrier for holes (h) between the p⁻-type anode layer 40 and the p⁺-type anode layer 30 is lowered. Thus, holes (h) are injected from the p⁺-type anode layer 30 into the p⁻-type anode layer 40. The injected holes (h) form a hole current hi.

The hole current hi increases with the increase of the width (length in the X-direction) of the p⁺-type anode layer 30 or the contact area between the p⁺-type anode layer 30 and the anode electrode 82. That is, by the width or the contact area, the amount of holes (h) injected from the anode side is adjusted.

Thus, in the on-state, holes (h) flow from the anode side to the cathode side, and electrons (e) flow from the cathode side to the anode side. Here, on the anode side, the p$^+$-type anode layer 30 contributes to the injection of holes (h), while the p$^-$-type anode layer 40 contributes only to the ejection of electrons (e). Thus, compared with a semiconductor device not provided with the p$^-$-type anode layer 40, the amount of injected holes (h) is suppressed. Furthermore, in the semiconductor device 110, the impurity concentration (third impurity concentration) of the p$^+$-type anode layer 30 can be lowered. This further suppresses the amount of injected holes (h).

Thus, in the semiconductor device 110, the switching speed is accelerated.

Next, as shown in FIG. 2B, a voltage (reverse bias) is applied between the anode and the cathode so that the potential of the anode electrode 82 is lower than the potential of the cathode electrode 81. This turns the semiconductor device 110 to the off-state. Here, the transition from the on-state to the off state is referred to as turn-off.

In the state in which the forward bias is applied between the anode and the cathode, when the reverse bias is applied, holes (h) existing in the n$^-$-type base layer 20 migrate to the anode electrode 82 side. Furthermore, electrons (e) existing in the n$^-$-type base layer 20 migrate to the cathode electrode 81 side.

At the time of reverse bias application, electrons (e) flow through the n$^+$-type cathode layer 10 into the cathode electrode 81. On the other hand, holes (h) flow through the p$^+$-type anode layer 30 into the anode electrode 82.

At turn-off time, electrons (e) flow to the cathode electrode 81, and holes (h) flow to the anode electrode 82. In this state, originating from the boundary portion between the p$^-$-type anode layer 40 and the n$^-$-type base layer 20, a depletion layer extends into the p$^-$-type anode layer 40 and the n$^-$-type base layer 20. This gradually blocks electrical continuity between the anode electrode 82 and the cathode electrode 81 in the semiconductor device 110, and turns the semiconductor device 110 to the off-state.

Thus, in the semiconductor device 110, in the on-state, the amount of injected holes (h) is suppressed. This reduces the extinction time of recovery current at turn-off time and accelerates the switching speed.

Next, a method for manufacturing the semiconductor device 110 is described.

Figure 3A:
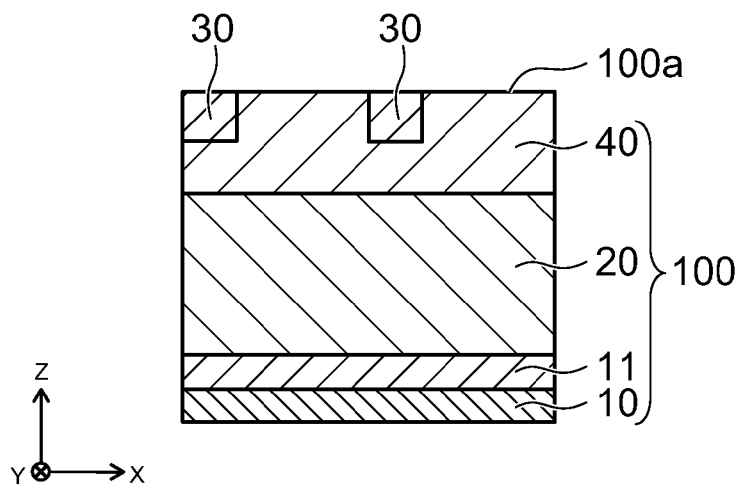
FIG. 3A to FIG. 3C are schematic sectional views illustrating the method for manufacturing the semiconductor device.
Figure 3B:
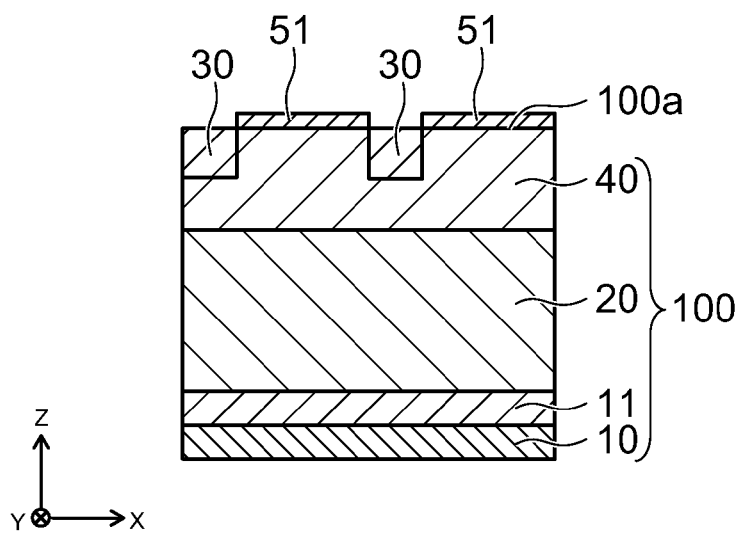
Figure 3C:
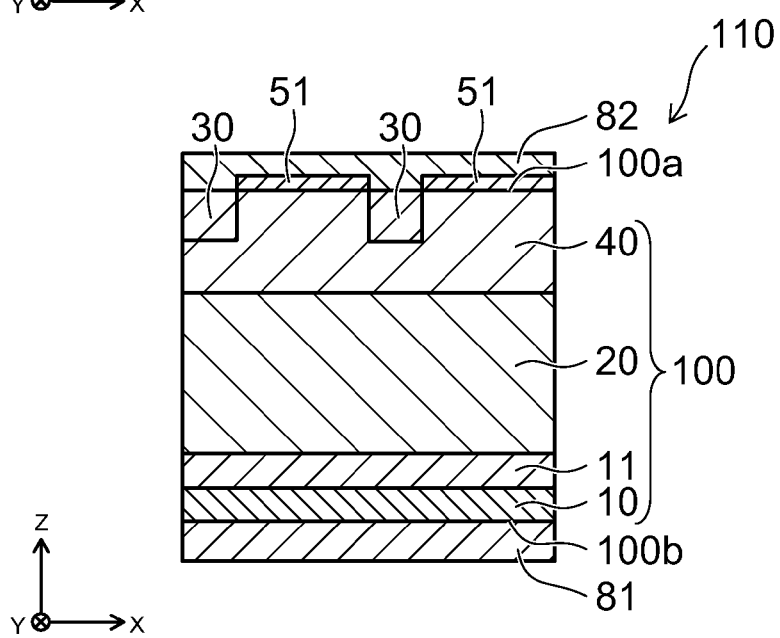

FIGS. 3A to 3C are schematic sectional views illustrating the method for manufacturing the semiconductor device.

First, as shown in FIG. 3A, a structural body 100 including an n$^+$-type cathode layer 10, an n-type buffer layer 11, an n$^-$-type base layer 20, and a p$^-$-type anode layer 40 is prepared. Next, in the first surface 100$a$ on the p$^-$-type anode layer 40 side of the structural body 100, a p$^+$-type anode layer 30 is selectively formed.

In forming the p$^+$-type anode layer 30, a mask (not shown) is formed above the first surface 100$a$ of the structural body 100. Then, a p-type impurity is ion implanted through the opening of the mask. After ion implantation, the p-type impurity is diffused by heat treatment. Thus, a p$^+$-type anode layer 30 is formed.

Next, as shown in FIG. 3B, above the p$^-$-type anode layer 40 exposed at the first surface 100$a$ of the structural body 100, a first barrier metal 51 is formed. The first barrier metal 51 is made of e.g. Ti or W. In forming the first barrier metal 51, for instance, a film of the material of the first barrier metal 51 (barrier metal material) is formed entirely above the first surface 100$a$. Then, the barrier metal material above the p$^+$-type anode layer 30 is removed by photolithography and etching. Accordingly, the barrier metal material is left only above the p$^-$-type anode layer 40. Thus, a first barrier metal 51 is formed.

Next, as shown in FIG. 3C, an anode electrode 82 is formed so as to cover the top of the p$^+$-type anode layer 30 and the top of the first barrier metal 51. Furthermore, a cathode electrode 81 is formed above the second surface 100$b$ on the opposite side from the first surface 100$a$ of the structural body 100. Thus, the semiconductor device 110 is completed.

In the semiconductor device 110 according to the first embodiment, the impurity concentration of the p$^+$-type anode layer 30 is made lower than that of the case not provided with the first barrier metal 51. Thus, in the semiconductor device 110, the switching speed is accelerated.

(Second Embodiment)

Next, a second embodiment is described.

Figure 4:
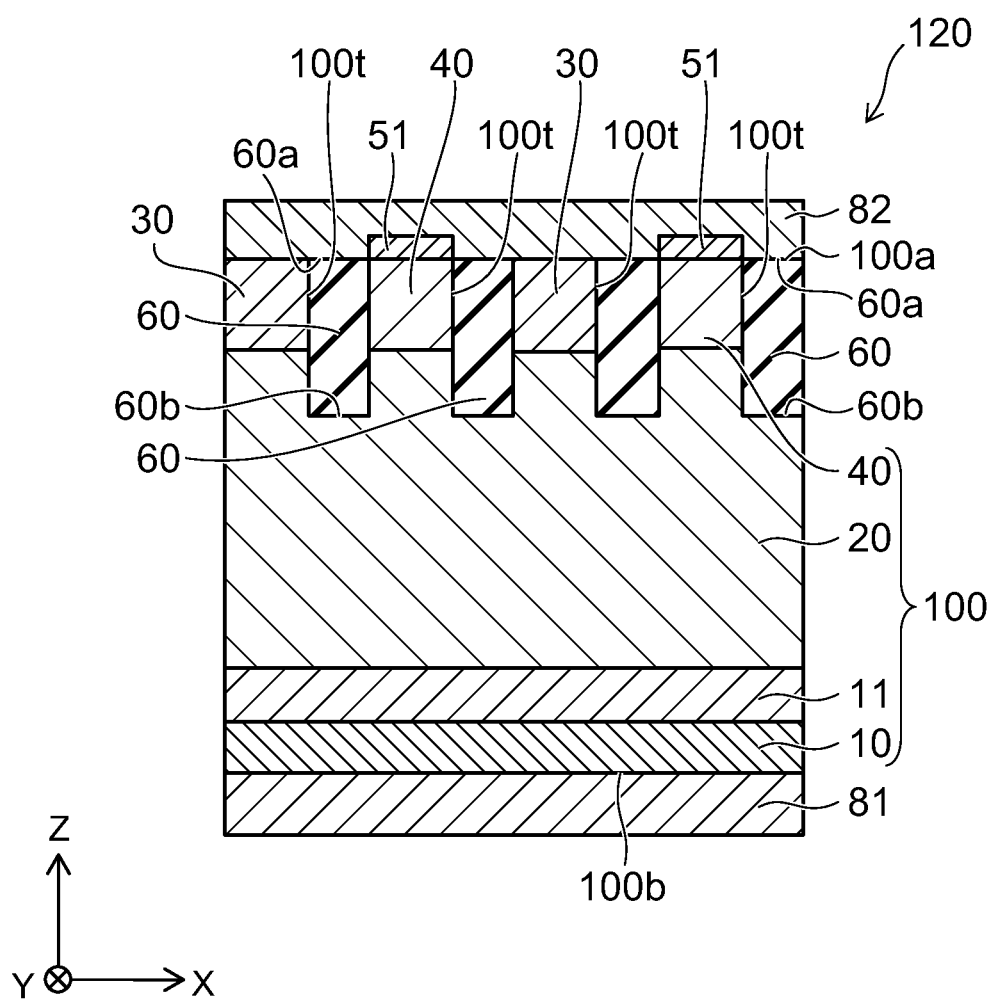
FIG. 4 is a schematic sectional view illustrating a semiconductor device according to the second embodiment.

FIG. 4 is a schematic sectional view illustrating a semiconductor device according to the second embodiment.

As shown in FIG. 4, the semiconductor device 120 according to the second embodiment includes a cathode electrode 81, an n$^+$-type cathode layer 10, an n$^-$-type base layer 20, a p$^+$-type anode layer 30, a p$^-$-type anode layer 40, an anode electrode 82, a first barrier metal 51, and an insulator 60. The semiconductor device 120 is e.g. a diode.

The insulator 60 is provided between the p$^+$-type anode layer 30 and the p$^-$-type anode layer 40. The insulator 60 is deeper than each of the depth of the p$^+$-type anode layer 30 and the depth of the p$^-$-type anode layer 40. The insulator 60 is embedded in a trench 100$t$ formed from the first surface 100$a$ of the structural body 100 in the Z-direction halfway through the n$^-$-type base layer 20. The position in the Z-direction of the upper surface 60$a$ of the insulator 60 is equal to or above the first surface 100$a$. The position in the Z-direction of the lower surface 60$b$ of the insulator 60 is below the p$^+$-type anode layer 30 and the p$^-$-type anode layer 40. The insulator 60 is made of e.g. silicon oxide (SiO$_2$). The insulator 60 serves to separate the p$^+$-type anode layer 30 from the p$^-$-type anode layer 40. The insulator 60 also serves to eliminate a useless region. Furthermore, in the semiconductor device 120 provided with the insulator 60, the breakdown withstand capability is improved.

Next, the operation of the semiconductor device 120 is described.

Figure 5A:
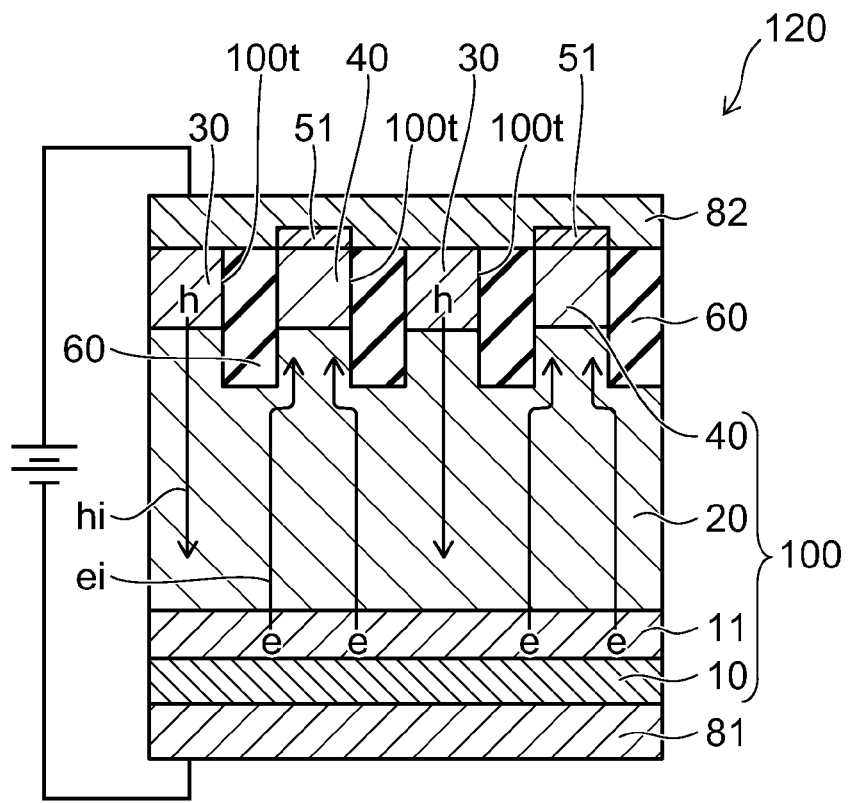
FIG. 5A and FIG. 5B are schematic sectional views describing the operation of the semiconductor device.
Figure 5B:
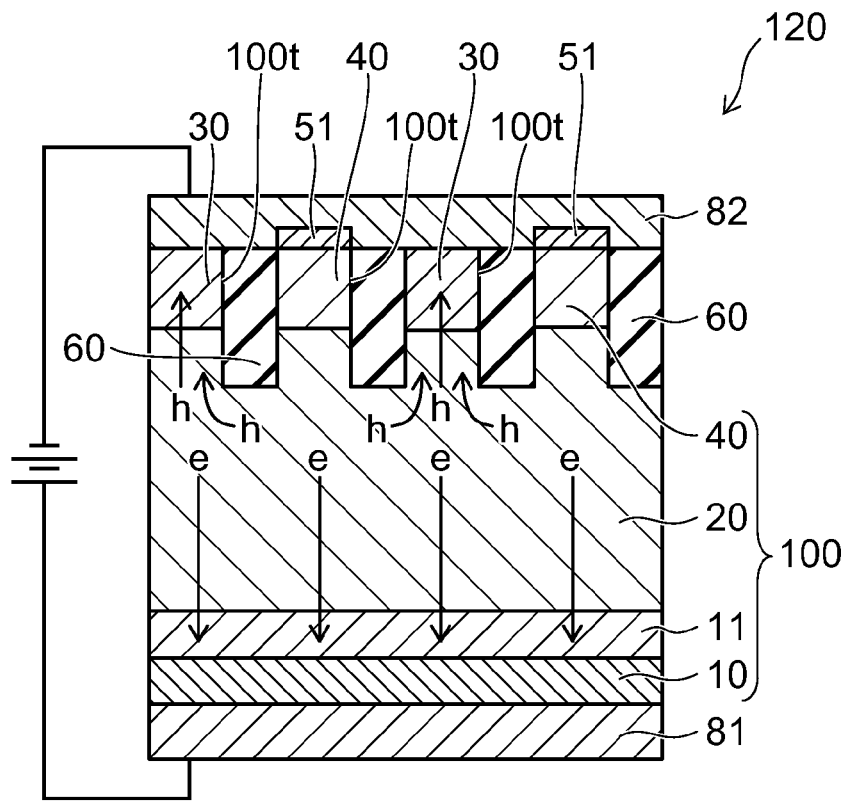

FIGS. 5A and 5B are schematic sectional views describing the operation of the semiconductor device.

FIG. 5A is a schematic sectional view describing the on-state. FIG. 5B is a schematic sectional view describing the off-state.

First, as shown in FIG. 5A, a voltage (forward bias) is applied between the anode and the cathode so that the potential of the anode electrode 82 is higher than the potential of the cathode electrode 81. This turns the semiconductor device 120 to the on-state.

In the semiconductor device 120, the n$^+$-type cathode layer 10 is in ohmic contact with the cathode electrode 81. Thus, electrons (e) migrate from the n$^+$-type cathode layer 10 through the n$^-$-type base layer 20 to the p$^-$-type anode layer 40.

The p$^-$-type anode layer 40 forms Schottky junction with the anode electrode 82. Thus, between the p$^-$-type anode layer 40 and the anode electrode 82, there is an energy barrier for holes (h), but no energy barrier for electrons (e). Accordingly, electrons (e) flow from the n$^+$-type cathode layer 10 through the n$^-$-type base layer 20 and the p$^-$-type anode layer 40 into the anode electrode 82. Thus, an electron current ei is formed between the cathode and the anode.

On the other hand, between the p⁻-type anode layer 40 and the p⁺-type anode layer 30, there is an energy barrier for electrons (e). Thus, the electrons (e) having flowed into the p⁻-type anode layer 40 do not easily flow into the p⁺-type anode layer 30. The electrons (e) directed to the p⁺-type anode layer 30 migrate in the lateral direction (direction along the XY-plane) near the p⁺-type anode layer 30 and near the insulator 60. By this migration of electrons (e), the portion below the p⁺-type anode layer 30 and below the insulator 60 is negatively biased relative to the anode electrode 82.

By this bias, below the p⁺-type anode layer 30, the energy barrier for holes (h) between the p⁻-type anode layer 40 and the p⁺-type anode layer 30 is lowered. Thus, holes (h) are injected from the p⁺-type anode layer 30 into the p⁻-type anode layer 40. The injected holes (h) form a hole current hi.

The hole current hi increases with the increase of the width (length in the X-direction) of the p⁺-type anode layer 30 or the contact area between the p⁺-type anode layer 30 and the anode electrode 82. That is, by the width or the contact area, the amount of holes (h) injected from the anode side is adjusted.

Thus, in the on-state, holes (h) flow from the anode side to the cathode side, and electrons (e) flow from the cathode side to the anode side. Here, on the anode side, the p⁺-type anode layer 30 contributes to the injection of holes (h), while the p⁻-type anode layer 40 contributes only to the ejection of electrons (e). Thus, compared with a semiconductor device not provided with the p⁻-type anode layer 40, the amount of injected holes (h) is suppressed. Furthermore, in the semiconductor device 120, the impurity concentration (third impurity concentration) of the p⁺-type anode layer 30 can be lowered. This further suppresses the amount of injected holes (h).

Thus, in the semiconductor device 120, the switching speed is accelerated.

Next, as shown in FIG. 5B, a voltage (reverse bias) is applied between the anode and the cathode so that the potential of the anode electrode 82 is lower than the potential of the cathode electrode 81. This turns the semiconductor device 120 to the off-state.

In the state in which the forward bias is applied between the anode and the cathode, when the reverse bias is applied, holes (h) existing in the n⁻-type base layer 20 migrate to the anode electrode 82 side. Furthermore, electrons (e) existing in the n⁻-type base layer 20 migrate to the cathode electrode 81 side.

At the time of reverse bias application, electrons (e) flow through the n⁺-type cathode layer 10 into the cathode electrode 81. On the other hand, holes (h) flow through the p⁺-type anode layer 30 into the anode electrode 82.

At turn-off time, electrons (e) flow to the cathode electrode 81, and holes (h) flow to the anode electrode 82. In this state, from the interface between the insulator 60 provided in the trench 100t and the n⁻-type base layer 20, a depletion layer extends into the n⁻-type base layer 20.

In the semiconductor device 120, in the on-state, the amount of injected holes (h) is suppressed. This reduces the extinction time of recovery current at turn-off time and accelerates the switching speed. Furthermore, if the spacing between two adjacent trenches 100t is narrowed, pinch-off occurs between these two trenches 100t. Thus, by lowering the impurity concentration of the p⁻-type anode layer 40, the switching speed is further accelerated.

Here, in a pin-diode, at turn-off time, electric field concentration may occur at a site of the p-n junction and cause avalanche. In the semiconductor device 120, the insulator 60 is provided from the first surface 100a of the structural body 100 halfway through the n⁻-type base layer 20. Thus, at turn-off time, the electric field concentrates more easily at the tip portion of the insulator 60. Accordingly, avalanche occurs more easily at the tip portion of the insulator 60.

In the semiconductor device 120, by the position of providing the insulator 60, the sites of causing avalanche are dispersed. This increases the breakdown withstand capability of the semiconductor device 120 at turn-off time.

Next, a method for manufacturing the semiconductor device 120 is described.

Figure 6A:
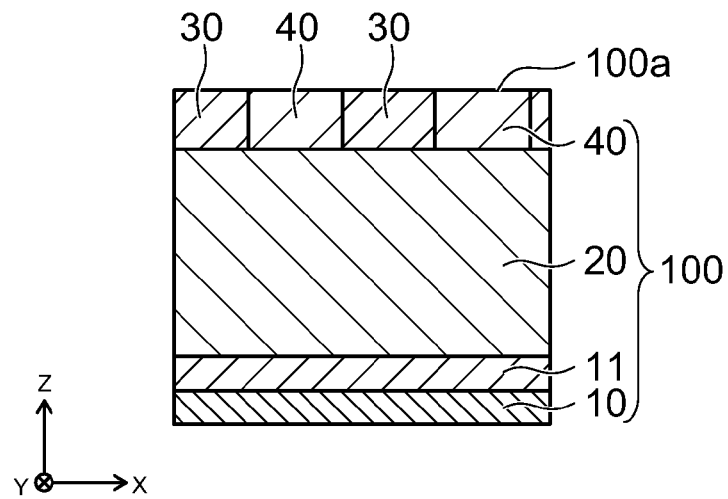
FIG. 6A to FIG. 6C are schematic sectional views illustrating the method for manufacturing the semiconductor device.
Figure 6B:
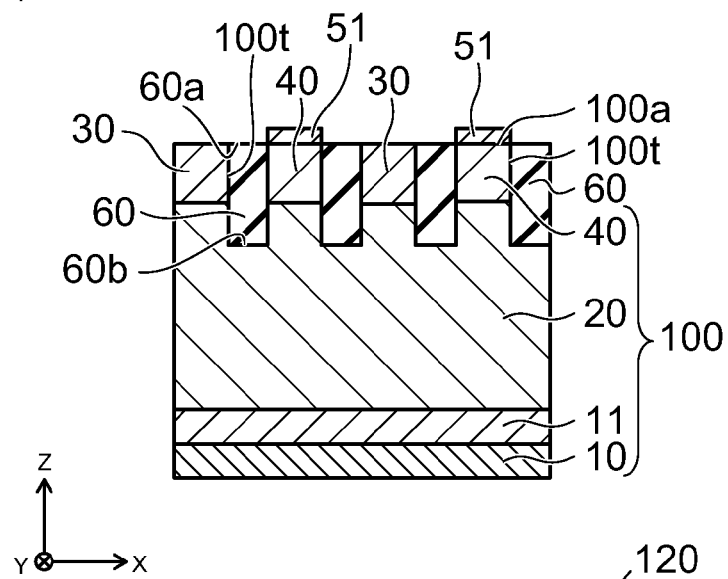
Figure 6C:
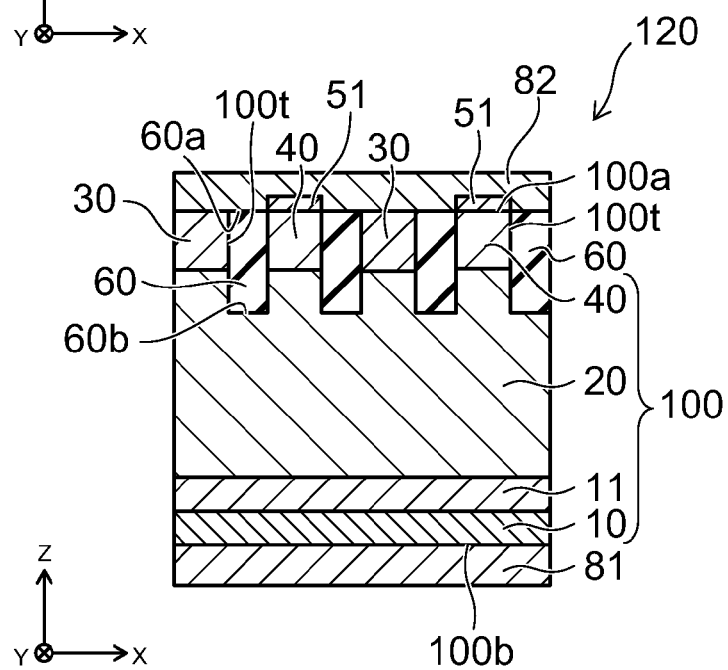

FIGS. 6A to 6C are schematic sectional views illustrating the method for manufacturing the semiconductor device.

First, as shown in FIG. 6A, a structural body 100 including an n⁺-type cathode layer 10, an n-type buffer layer 11, an n⁻-type base layer 20, and a p⁻-type anode layer 40 is prepared. Next, in the first surface 100a on the p⁻-type anode layer 40 side of the structural body 100, a p⁺-type anode layer 30 is selectively formed.

In forming the p⁺-type anode layer 30, a mask (not shown) is formed above the first surface 100a of the structural body 100. Then, a p-type impurity is ion implanted through the opening of the mask. After ion implantation, the p-type impurity is diffused by heat treatment. Thus, a p⁺-type anode layer 30 is formed.

Next, as shown in FIG. 6B, a trench 100t is formed from the first surface 100a of the structural body 100 in the Z-direction halfway through the n⁻-type base layer 20. The trench 100t is formed between the p⁻-type anode layer 40 and the p⁺-type anode layer 30. Next, an insulator 60 is embedded in the trench 100t. The insulator 60 is made of e.g. SiO₂.

Next, above the p⁻-type anode layer 40 exposed at the first surface 100a of the structural body 100, a first barrier metal 51 is formed. The first barrier metal 51 is made of e.g. Ti or W. In forming the first barrier metal 51, for instance, a film of the material of the first barrier metal 51 (barrier metal material) is formed entirely above the first surface 100a. Then, the barrier metal material above the p⁺-type anode layer 30 is removed by photolithography and etching. Accordingly, the barrier metal material is left only above the p⁻-type anode layer 40. Thus, a first barrier metal 51 is formed.

Next, as shown in FIG. 6C, an anode electrode 82 is formed so as to cover the top of the insulator 60, the top of the p⁺-type anode layer 30, and the top of the first barrier metal 51. Furthermore, a cathode electrode 81 is formed above the second surface 100b on the opposite side from the first surface 100a of the structural body 100. Thus, the semiconductor device 120 is completed.

In the semiconductor device 120 according to the second embodiment, like the semiconductor device 110, the switching speed is accelerated. Furthermore, in the semiconductor device 120, compared with the case of not providing the insulator 60, the breakdown withstand capability at turn-off time is increased.

(Third Embodiment)

Next, a third embodiment is described.

Figure 7:
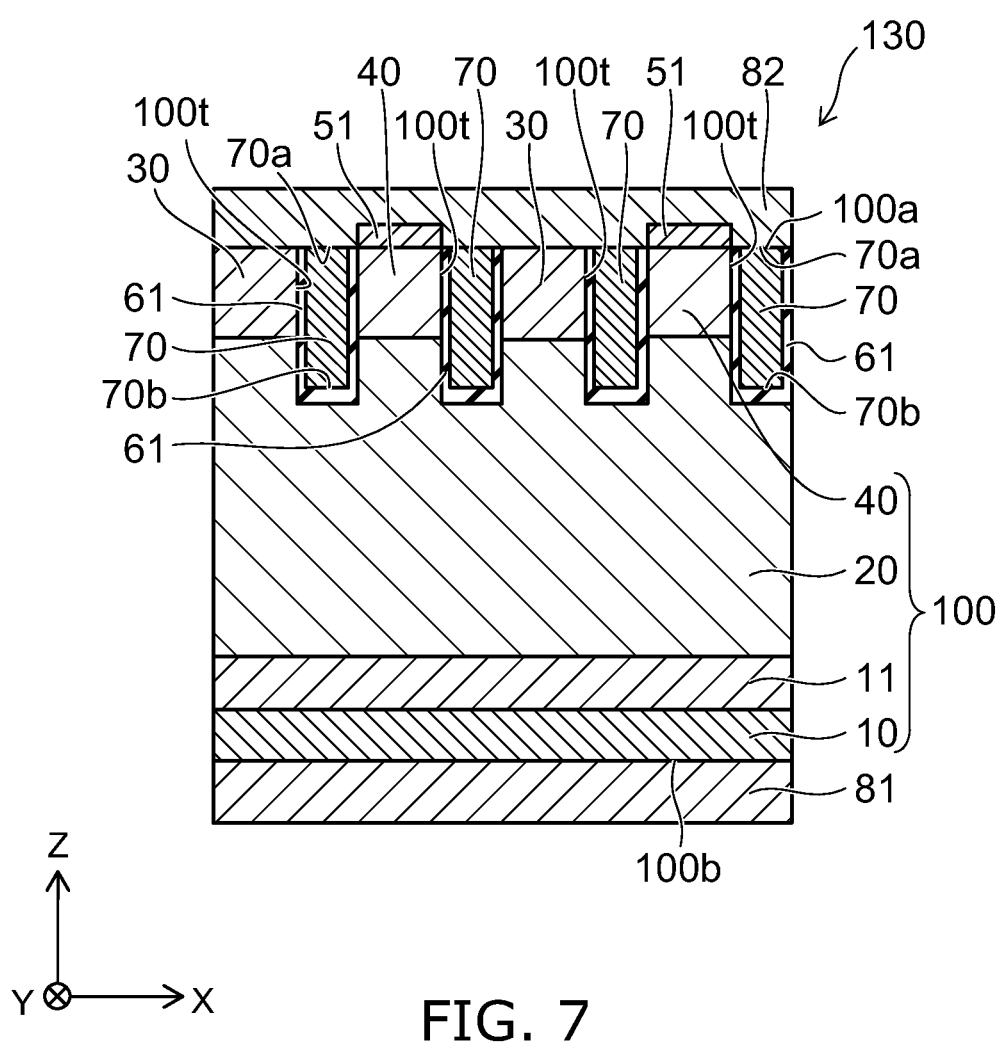
FIG. 7 is a schematic sectional view illustrating a semiconductor device according to the third embodiment.

FIG. 7 is a schematic sectional view illustrating a semiconductor device according to the third embodiment.

As shown in FIG. 7, the semiconductor device 130 according to the third embodiment includes a cathode electrode 81, an n⁺-type cathode layer 10, an n⁻-type base layer 20, a p⁺-type anode layer 30, a p⁻-type anode layer 40, an anode electrode 82, a first barrier metal 51, a conductor 70, and an insulating film 61. The semiconductor device 130 is e.g. a diode.

The conductor 70 is provided between the p⁺-type anode layer 30 and the p⁻-type anode layer 40. The conductor 70 is electrically connected to the anode electrode 82. The conductor 70 is deeper than each of the depth of the p⁺-type anode layer 30 and the depth of the p⁻-type anode layer 40. The conductor 70 is made of e.g. polysilicon.

The insulating film 61 is provided between the conductor 70 and the p⁺-type anode layer 30, between the conductor 70 and the p⁻-type anode layer 40, and between the conductor 70 and the n⁻-type base layer 20. The insulating film 61 is made of e.g. $SiO_2$.

The conductor 70 and the insulating film 61 are provided in a trench 100t formed from the first surface 100a of the structural body 100 in the Z-direction halfway through the n⁻-type base layer 20. The insulating film 61 is provided along the inner wall of the trench 100t. The conductor 70 is embedded in the trench 100t via the insulating film 61. The position in the Z-direction of the upper surface 70a of the conductor 70 is equal to or above the first surface 100a. The position in the Z-direction of the lower surface 70b of the conductor 70 is below the p⁺-type anode layer 30 and the p⁻-type anode layer 40.

The operation of the semiconductor device 130 is similar to that of the semiconductor device 120. In the semiconductor device 130, the potential of the conductor 70 is equal to the potential of the anode electrode 82. Thus, in the case where a reverse bias is applied to the semiconductor device 130, from the interface between the insulating film 61 provided in the trench 100t and the n⁻-type base layer 20, a depletion layer extends into the n⁻-type base layer 20. At turn-off time, the electric field concentrates more easily at the lower end portion (particularly at the corner) of the trench 100t. Accordingly, avalanche occurs more easily at the lower end portion of the trench 100t.

In the semiconductor device 130, by the position of the trench 100t including the conductor 70 and the insulating film 61, the sites of causing avalanche are dispersed. This increases the breakdown withstand capability of the semiconductor device 130 at turn-off time. Furthermore, if the spacing between two adjacent trenches 100t is narrowed, pinch-off occurs between these two trenches 100t. Thus, by lowering the impurity concentration of the p⁻-type anode layer 40, the switching speed is accelerated.

Next, a method for manufacturing the semiconductor device 130 is described.

Figure 8A:
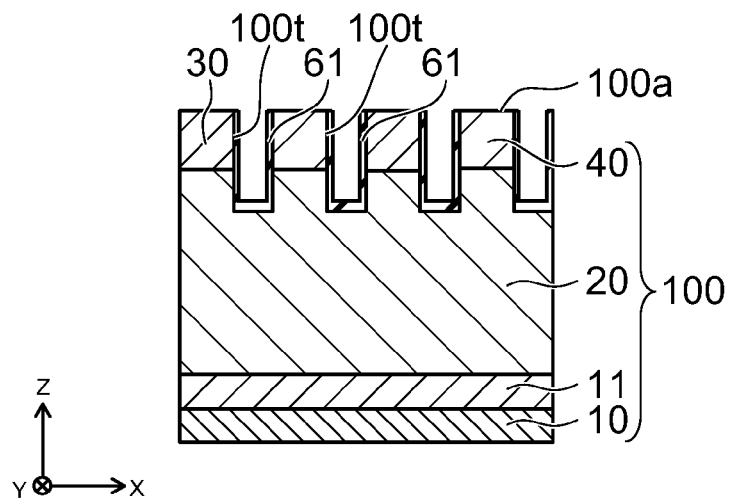
FIG. 8A to FIG. 8C are schematic sectional views illustrating the method for manufacturing the semiconductor device.
Figure 8B:
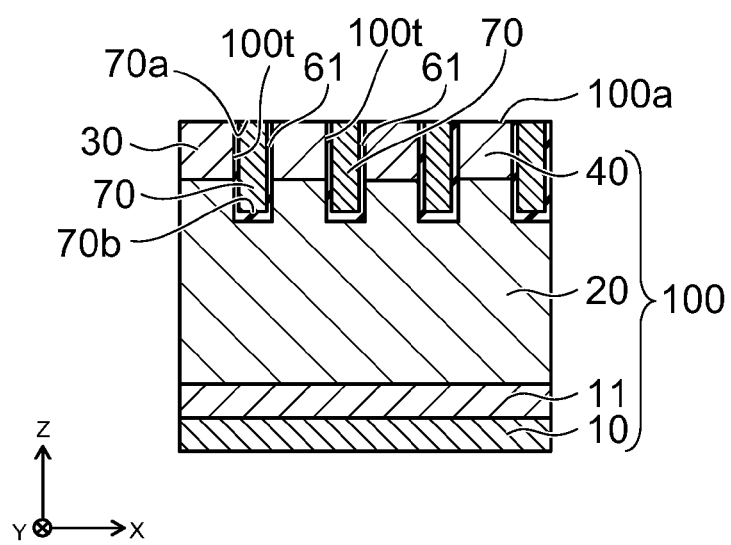
Figure 8C:
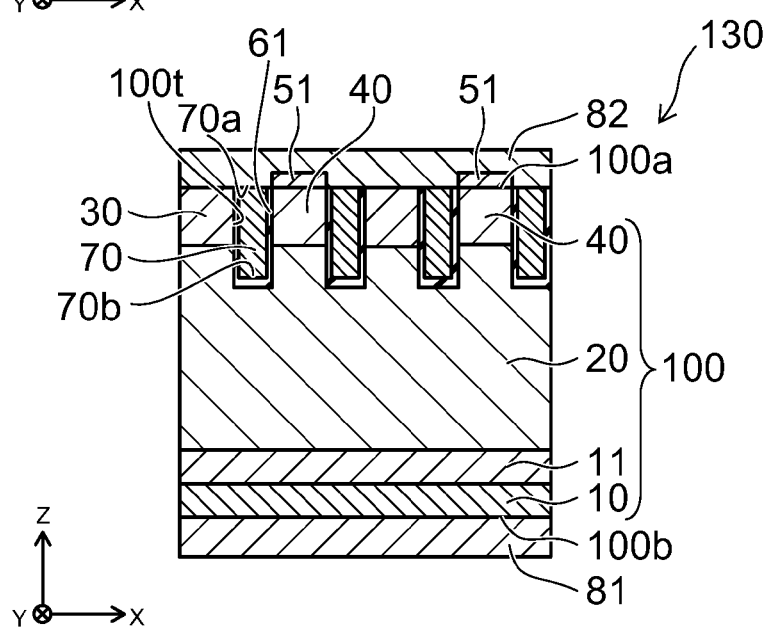

FIGS. 8A to 8C are schematic sectional views illustrating the method for manufacturing the semiconductor device.

First, as shown in FIG. 8A, a structural body 100 including an n⁺-type cathode layer 10, an n-type buffer layer 11, an n⁻-type base layer 20, and a p⁻-type anode layer 40 is prepared. Next, in the first surface 100a on the p⁻-type anode layer 40 side of the structural body 100, a p⁺-type anode layer 30 is selectively formed.

In forming the p⁺-type anode layer 30, a mask (not shown) is formed above the first surface 100a of the structural body 100. Then, a p-type impurity is ion implanted through the opening of the mask. After ion implantation, the p-type impurity is diffused by heat treatment. Thus, a p⁺-type anode layer 30 is formed.

Next, a trench 100t is formed from the first surface 100a of the structural body 100 in the Z-direction halfway through the n⁻-type base layer 20. The trench 100t is formed between the p⁻-type anode layer 40 and the p⁺-type anode layer 30. Next, an insulating film 61 is formed above the inner wall of the trench 100t. The insulating film 61 is made of e.g. $SiO_2$. The insulating film 61 is formed by depositing e.g. $SiO_2$ above the inner wall of the trench 100t by e.g. CVD (chemical vapor deposition). Alternatively, a thermal oxidation film may be formed as an insulating film 61 above the inner wall of the trench 100t by heat treatment.

Next, as shown in FIG. 8B, a conductor 70 is embedded via the insulating film 61 in the trench 100t. The conductor 70 is made of e.g. polysilicon. The semiconductor device 130 may be formed as an FWD (free wheeling diode) of the IGBT in conjunction with the manufacturing of the IGBT. In this case, the insulating film and the conductor 70 may be formed in the same manufacturing step as the step of forming the trench gate of the IGBT.

Next, as shown in FIG. 8C, above the p⁻-type anode layer 40 exposed at the first surface 100a of the structural body 100, a first barrier metal 51 is formed. The first barrier metal 51 is made of e.g. Ti or W. In forming the first barrier metal 51, for instance, a film of the material of the first barrier metal 51 (barrier metal material) is formed entirely above the first surface 100a. Then, the barrier metal material above the p⁺-type anode layer 30 is removed by photolithography and etching. Accordingly, the barrier metal material is left only above the p⁻-type anode layer 40. Thus, a first barrier metal 51 is formed.

Next, an anode electrode 82 is formed so as to cover the top of the insulating film 61, the top of the conductor 70, the top of the p⁺-type anode layer 30, and the top of the first barrier metal 51. Furthermore, a cathode electrode 81 is formed above the second surface 100b on the opposite side from the first surface 100a of the structural body 100. Thus, the semiconductor device 130 is completed.

In the semiconductor device 130 according to the third embodiment, like the semiconductor device 110, the switching speed is accelerated. Furthermore, in the semiconductor device 130, compared with the case of not providing the conductor 70 and the insulating film 61, the breakdown withstand capability at turn-off time is increased.

(Fourth Embodiment)

Next, a fourth embodiment is described.

Figure 9:
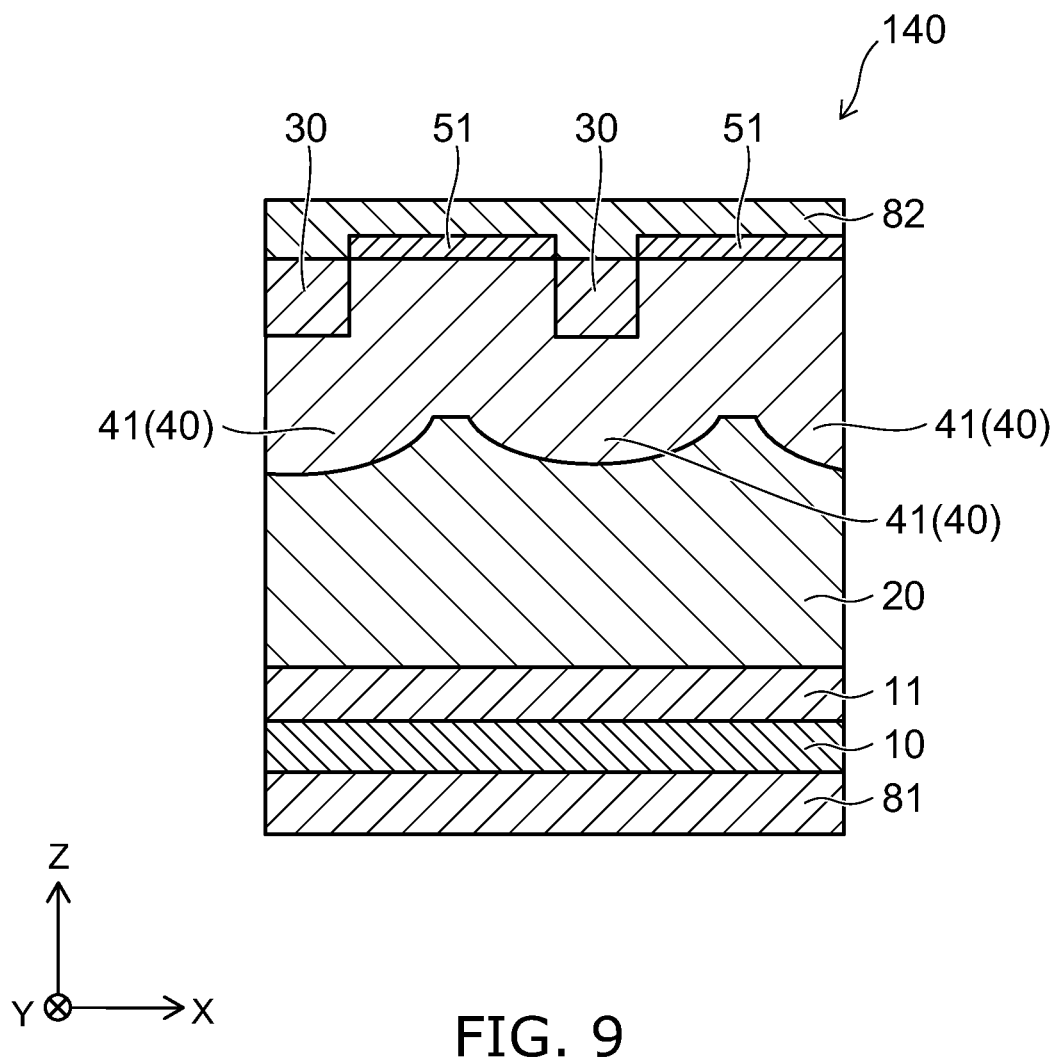
FIG. 9 is a schematic sectional view illustrating a semiconductor device according to the fourth embodiment.

FIG. 9 is a schematic sectional view illustrating a semiconductor device according to the fourth embodiment.

As shown in FIG. 9, the semiconductor device 140 according to the fourth embodiment includes a cathode electrode 81, an n⁺-type cathode layer 10, an n⁻-type base layer 20, a p⁺-type anode layer 30, a p⁻-type anode layer 40, an anode electrode 82, and a first barrier metal 51. The semiconductor device 140 is e.g. a diode.

In the semiconductor device 140, the p⁻-type anode layer 40 includes a first portion 41 provided between the n⁻-type base layer 20 and the p⁺-type anode layer 30. The boundary portion of the first portion 41 with the n⁻-type base layer 20 is convexly curved toward the n⁻-type base layer 20.

The operation of the semiconductor device 140 is similar to that of the semiconductor device 110. In the semiconductor device 140, by the curved shape of the first portion 41, at turn-off time, the electric field concentrates more easily at the first portion 41. Accordingly, avalanche occurs more easily near the first portion 41. In the semiconductor device 140, by the position of the first portion 41, the sites of causing avalanche are dispersed. This increases the breakdown withstand capability of the semiconductor device 140 at turn-off time.

Furthermore, the first portion 41 likely to cause avalanche is provided near the lower side of the p⁺-type anode layer 30. Thus, carriers are effectively extracted from the neighborhood of the site where avalanche has occurred. This further increases the breakdown withstand capability.

Next, a method for manufacturing the semiconductor device 140 is described.

Figure 10A:
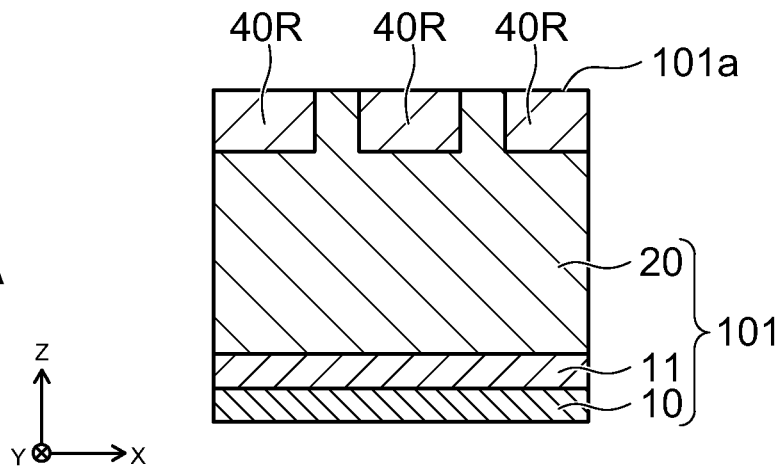
FIG. 10A to FIG. 10C are schematic sectional views illustrating the method for manufacturing the semiconductor device.
Figure 10B:
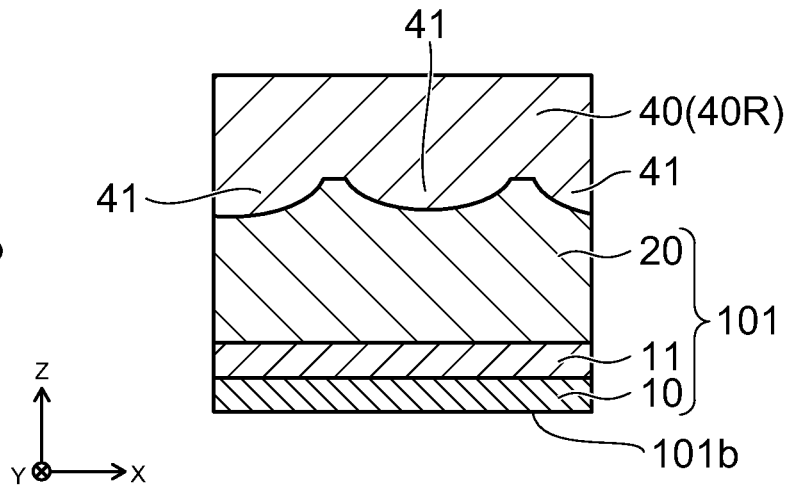
Figure 10C:
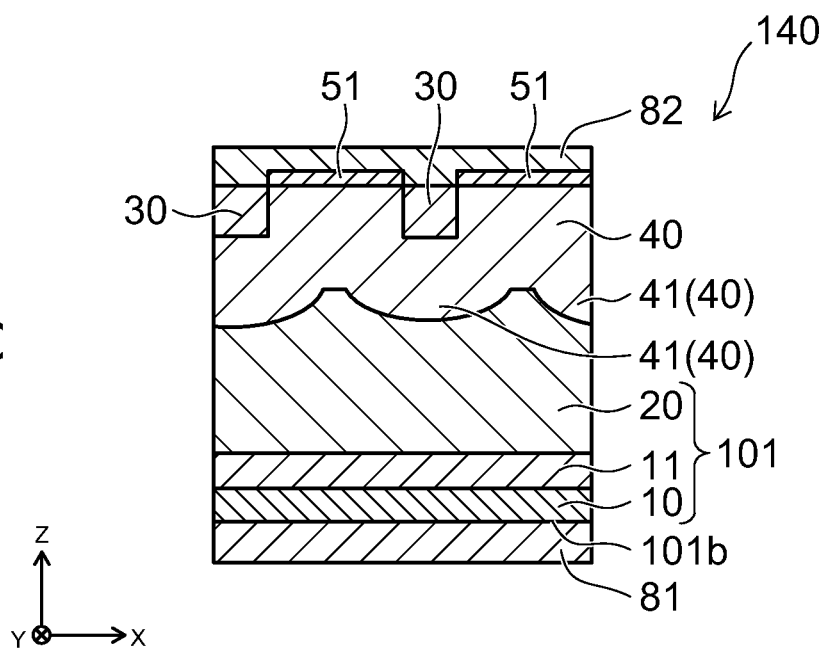

FIGS. 10A to 10C are schematic sectional views illustrating the method for manufacturing the semiconductor device.

First, as shown in FIG. 10A, a structural body 101 including an $n^+$-type cathode layer 10, an n-type buffer layer 11, and an $n^-$-type base layer 20 is prepared. Next, in the first surface 101a on the $n^-$-type base layer 20 side of the structural body 101, a $p^-$-type region 40R is selectively formed. In forming the $p^-$-type region 40R, a mask (not shown) is formed above the first surface 101a of the structural body 101. Then, a p-type impurity is ion implanted through the opening of the mask.

Next, as shown in FIG. 10B, the p-type impurity of the $p^-$-type region 40R is diffused by heat treatment. Thus, a $p^-$-type anode layer 40 is formed. By the condition of the impurity concentration, position, size, and heat treatment of the $p^-$-type region 40R, a first portion 41 is formed in the $p^-$-type anode layer 40. The first portion 41 is convexly curved toward the $n^-$-type base layer 20 by thermal diffusion of the $p^-$-type region 40R.

Next, as shown in FIG. 10C, above the $p^-$-type anode layer 40 exposed at the first surface 101a of the structural body 101, a first barrier metal 51 is formed. The first barrier metal 51 is made of e.g. Ti or W. In forming the first barrier metal 51, for instance, a film of the material of the first barrier metal 51 (barrier metal material) is formed entirely above the first surface 101a. Then, the barrier metal material above the $p^+$-type anode layer 30 is removed by photolithography and etching. Accordingly, the barrier metal material is left only above the $p^-$-type anode layer 40. Thus, a first barrier metal 51 is formed.

Next, an anode electrode 82 is formed so as to cover the top of the $p^+$-type anode layer 30 and the top of the first barrier metal 51. Furthermore, a cathode electrode 81 is formed above the second surface 101b on the opposite side from the first surface 101a of the structural body 101. Thus, the semiconductor device 140 is completed.

In the semiconductor device 140 according to the fourth embodiment, like the semiconductor device 110, the switching speed is accelerated. Furthermore, in the semiconductor device 140, compared with the case of not providing the first portion 41, the breakdown withstand capability at turn-off time is increased.

(Fifth Embodiment)

Figure 11:
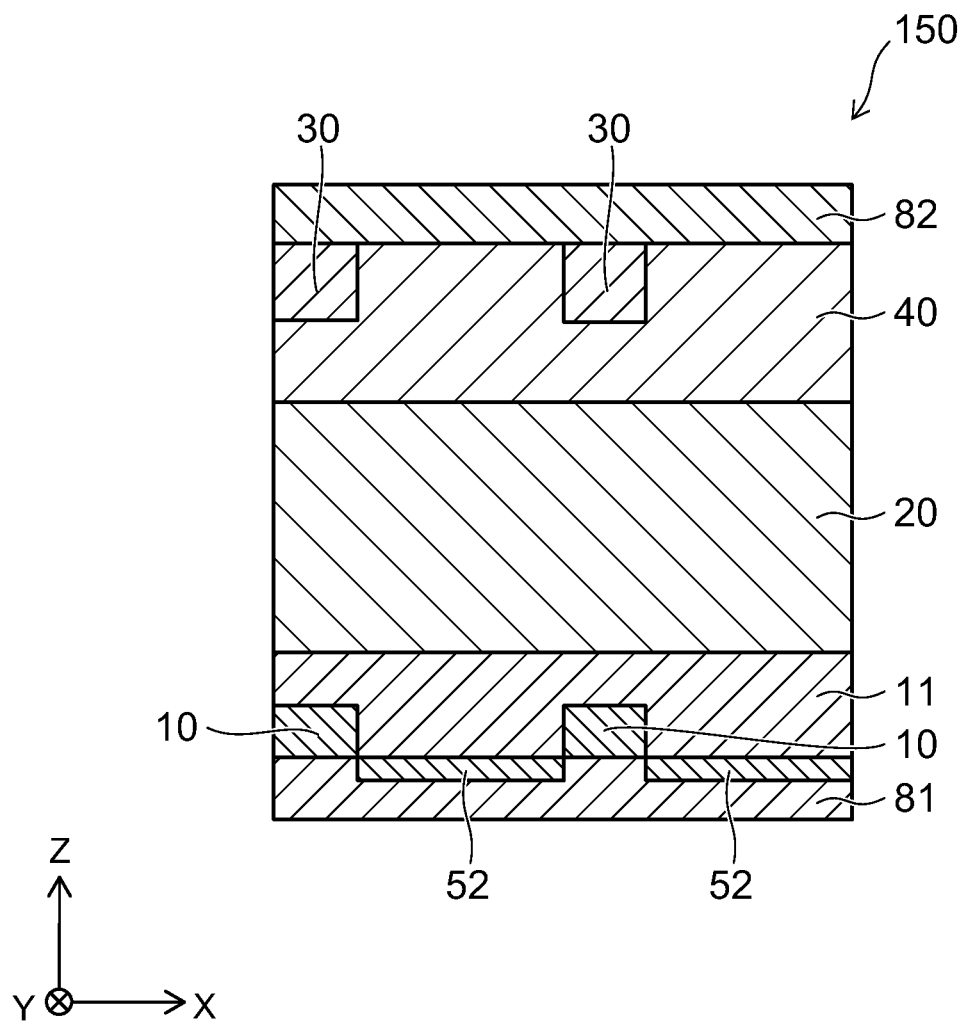
FIG. 11 is a schematic sectional view illustrating a semiconductor device according to a fifth embodiment.

FIG. 11 is a schematic sectional view illustrating a semiconductor device according to a fifth embodiment.

As shown in FIG. 11, the semiconductor device 150 according to the fifth embodiment includes a cathode electrode 81, an $n^+$-type cathode layer 10, an $n^-$-type base layer 20, a $p^+$-type anode layer 30, a $p^-$-type anode layer 40, an anode electrode 82, an n-type buffer layer 11, and a second barrier metal 52 as a second intermediate metal film. The semiconductor device 150 is e.g. a diode.

In the semiconductor device 150, the n-type buffer layer 11 is provided above the cathode electrode 81. The second barrier metal 52 is provided between the cathode electrode 81 and the n-type buffer layer 11. The second barrier metal 52 forms Schottky junction with the n-type buffer layer 11.

The second barrier metal 52 is electrically connected to the cathode electrode 81. The second barrier metal 52 is made of e.g. titanium (Ti) or tungsten (W). The second barrier metal 52 may be a monolayer film of a metal material, or a multilayer film in which a plurality of metal materials are stacked. The work function of the material of the second barrier metal 52 is larger than the work function of the material of the cathode electrode 81.

In the semiconductor device 150, the second barrier metal 52 is provided between the cathode electrode 81 and the n-type buffer layer 11. Thus, irrespective of the material of the cathode electrode 81, a reliable Schottky junction is obtained between the n-type buffer layer 11 and the metal (second barrier metal 52) electrically connected to the cathode electrode 81.

On the other hand, the second barrier metal 52 is not interposed between the $n^+$-type cathode layer 10 and the cathode electrode 81. Thus, a reliable ohmic contact is obtained between the cathode electrode 81 and the $n^+$-type cathode layer 10. That is, in the semiconductor device 150, even if the impurity concentration (first impurity concentration) of the $n^+$-type cathode layer 10 is lowered, a sufficient ohmic contact is obtained between the $n^+$-type cathode layer 10 and the cathode electrode 81.

Next, the operation of the semiconductor device 150 is described.

First, a voltage (forward bias) is applied between the anode and the cathode so that the potential of the anode electrode 82 is higher than the potential of the cathode electrode 81. This turns the semiconductor device 150 to the on-state.

In the semiconductor device 150, the n-type buffer layer 11 forms Schottky junction with the cathode electrode 81. Thus, between the n-type buffer layer 11 and the cathode electrode 81, there is an energy barrier for electrons, but no energy barrier for holes. Accordingly, holes flow from the $p^-$-type anode layer 40 through the $n^-$-type base layer 20 and the n-type buffer layer 11 into the cathode electrode 81. Thus, a hole current is formed between the cathode and the anode.

On the other hand, between the $n^+$-type cathode layer 10 and the n-type buffer layer 11, there is an energy barrier for holes. Thus, the holes having flowed into the n-type buffer layer 11 do not easily flow into the $n^+$-type cathode layer 10. The holes directed to the $n^+$-type cathode layer 10 migrate in the lateral direction (direction along the XY-plane) near the $n^+$-type cathode layer 10. By this migration of holes, the portion above the $n^+$-type cathode layer 10 is positively biased relative to the cathode electrode 81.

By this bias, above the $n^+$-type cathode layer 10, the energy barrier for electrons between the n-type buffer layer 11 and the $n^+$-type cathode layer 10 is lowered. Thus, electrons are injected from the $n^+$-type cathode layer 10 into the n-type buffer layer 11. The injected electrons form an electron current.

The electron current increases with the increase of the width (length in the X-direction) of the $n^+$-type cathode layer 10 or the contact area between the $n^+$-type cathode layer 10 and the cathode electrode 81. That is, by the width or the contact area, the amount of electrons injected from the cathode side is adjusted.

Here, on the cathode side, the $n^+$-type cathode layer 10 contributes to the injection of electrons, while the n-type buffer layer 11 contributes only to the ejection of holes. Thus, compared with a semiconductor device not provided with the n-type buffer layer 11, the amount of injected electrons is suppressed. Furthermore, in the semiconductor device 150, the impurity concentration (first impurity concentration) of the $n^+$-type cathode layer 10 can be lowered. This further suppresses the amount of injected electrons. Thus, in the semiconductor device 150, the switching speed is accelerated.

Next, a voltage (reverse bias) is applied between the anode and the cathode so that the potential of the anode electrode 82 is lower than the potential of the cathode electrode 81. This turns the semiconductor device 150 to the off-state.

In the state in which the forward bias is applied between the anode and the cathode, when the reverse bias is applied, holes existing in the n$^-$-type base layer 20 migrate to the anode electrode 82 side. Furthermore, electrons existing in the n$^-$-type base layer 20 migrate to the cathode electrode 81 side.

At the time of reverse bias application, electrons flow through the n$^+$-type cathode layer 10 into the cathode electrode 81. On the other hand, holes flow through the p$^+$-type anode layer 30 into the anode electrode 82.

At turn-off time, electrons flow to the cathode electrode 81, and holes flow to the anode electrode 82. In this state, originating from the boundary portion between the p$^-$-type anode layer 40 and the n$^-$-type base layer 20 and the boundary portion between the p$^+$-type anode layer 30 and the n$^-$-type base layer 20, a depletion layer extends into the p$^-$-type anode layer 40, the p$^+$-type anode layer 30, and the n$^-$-type base layer 20. This gradually blocks electrical continuity between the anode electrode 82 and the cathode electrode 81 in the semiconductor device 150, and turns the semiconductor device 150 to the off-state.

In the semiconductor device 150 according to the fifth embodiment, in the on-state, the amount of injected electrons is suppressed. This reduces the extinction time of recovery current at turn-off time. Thus, the switching speed is accelerated.

(Sixth Embodiment)

Figure 12:
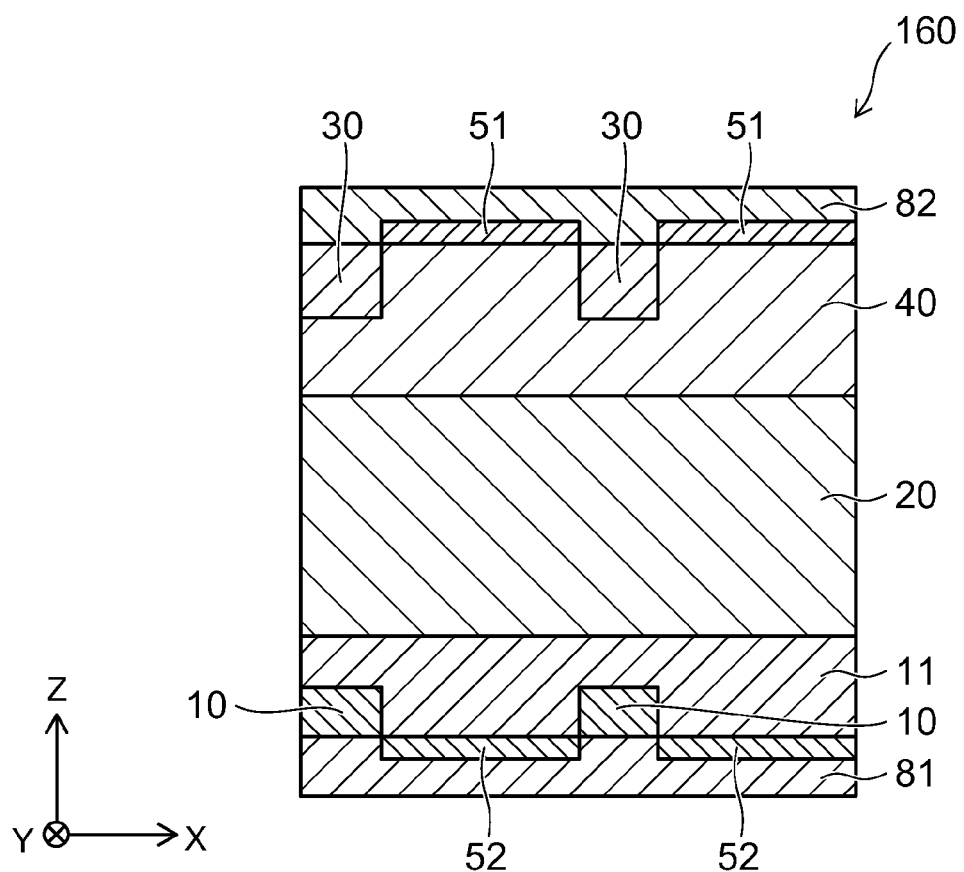
FIG. 12 is a schematic sectional view illustrating a semiconductor device according to a sixth embodiment.

FIG. 12 is a schematic sectional view illustrating a semiconductor device according to a sixth embodiment.

As shown in FIG. 12, the semiconductor device 160 according to the sixth embodiment includes a first barrier metal 51 in addition to the configuration of the semiconductor device 150 shown in FIG. 11. That is, the semiconductor device 160 includes a first barrier metal 51 provided between the anode electrode 82 and the p$^-$-type anode layer 40, and a second barrier metal 52 provided between the cathode electrode 81 and the n-type buffer layer 11.

The operation of the semiconductor device 160 is similar to that of the semiconductor devices 110 and 150. In the semiconductor device 160, carrier concentration and concentration balance are set on the anode side and the cathode side of the n$^-$-type base layer 20. In the semiconductor device 160, in conjunction with the acceleration of switching speed, reduction of low current oscillation and reduction of recovery loss are achieved.

Figure 13:
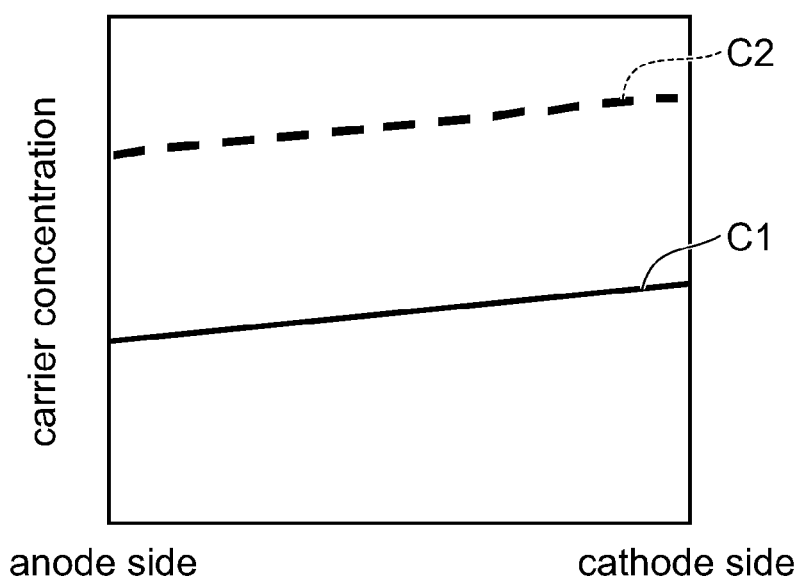
FIG. 13 is a schematic diagram illustrating carrier concentration.

FIG. 13 is a schematic diagram illustrating carrier concentration.

FIG. 13 shows a carrier concentration distribution on the anode side and the cathode side of the n$^-$-type base layer 20. The distribution C1 of FIG. 13 schematically shows a carrier concentration distribution in the semiconductor device 160. The distribution C2 of FIG. 13 schematically shows a carrier concentration distribution in a semiconductor device not including the first barrier metal 51 and the second barrier metal 52.

As shown in the distribution C1, in the semiconductor device 160, by including the first barrier metal 51, the impurity concentration of the p$^+$-type anode layer 30 is lowered. Thus, the carrier concentration on the anode side of the semiconductor device 160 is made lower than the carrier concentration on the cathode side of the distribution C2.

Furthermore, in the semiconductor device 160, by including the second barrier metal 52, the impurity concentration of the n$^+$-type cathode layer 10 is lowered. Thus, the carrier concentration on the cathode side of the semiconductor device 160 is made lower than the carrier concentration on the cathode side of the distribution C2.

Here, acceleration of switching speed, reduction of low current oscillation, and reduction of recovery loss are desired without lifetime control for reducing the lifetime of carriers. To this end, balance of carrier concentration on the anode side and the cathode side is important in conjunction with the reduction of the carrier concentration of the n$^-$-type base layer 20.

Figure 14A:
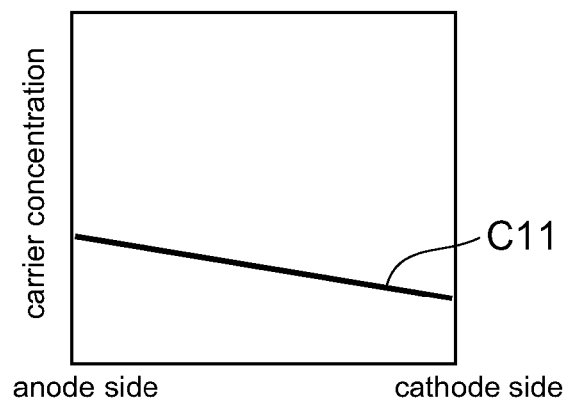
FIG. 14A to FIG. 14C are schematic diagrams illustrating the balance of carrier concentration.
Figure 14B:
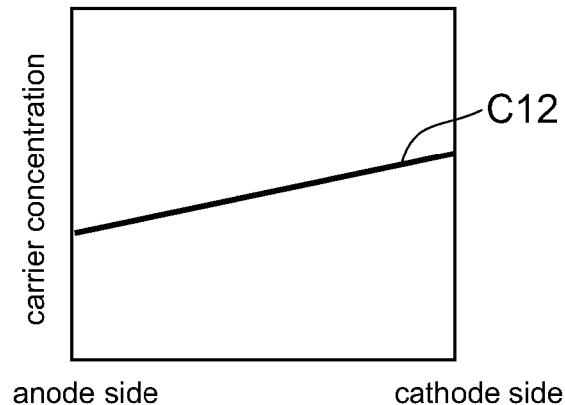
Figure 14C:
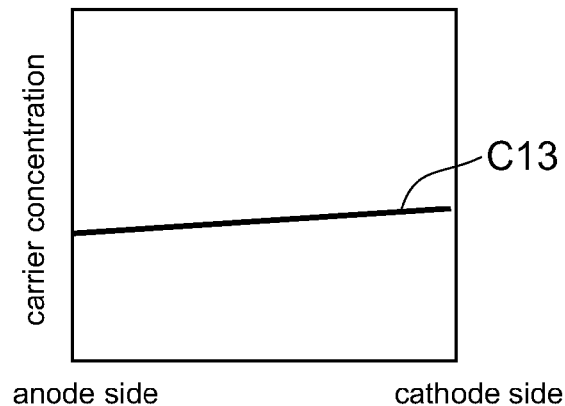

FIGS. 14A to 14C are schematic diagrams illustrating the balance of carrier concentration.

In the semiconductor device 160, the balance of carrier concentration is achieved by adjusting the impurity concentration of the p$^+$-type anode layer 30 and the impurity concentration of the n$^+$-type cathode layer 10.

In the distribution C11 shown in FIG. 14A, the carrier concentration on the cathode side is lower than the carrier concentration on the anode side. In such a distribution C11, at recovery time, depletion is more likely to occur from the cathode side of the n$^-$-type base layer 20. This may cause low current oscillation.

In the distribution C12 shown in FIG. 14B, the carrier concentration on the cathode side is higher than the carrier concentration on the anode side. Such a distribution C12 leads to the increase of recovery loss.

In the distribution C13 shown in FIG. 14C, the carrier concentration is nearly constant from the anode side to the cathode side, or slightly higher on the cathode side than on the anode side. Such a distribution C13 suppresses the occurrence of low current oscillation, and also suppresses the increase of recovery loss.

In the semiconductor device 160, the carrier concentration is reduced as shown in FIG. 13. Furthermore, the carrier concentration distribution is set as in the distribution C13 shown in FIG. 14C. Thus, in the semiconductor device 160, acceleration of switching speed, reduction of low current oscillation, and reduction of recovery loss are achieved without lifetime control.

As described above, the semiconductor device according to the embodiments can achieve characteristics improvement such as reduction of switching time.

For instance, in the description of the above embodiments, the first conductivity type is n-type, and the second conductivity type is p-type. However, the invention is also practicable when the first conductivity type is p-type and the second conductivity type is n-type.

In the description of the above embodiments, Si is used as an example of the semiconductor. However, the semiconductor may be e.g. a compound semiconductor such as silicon carbide (SiC) or gallium nitride (GaN), or a wide bandgap semiconductor such as diamond. Furthermore, in the description of the above embodiments, a diode is taken as an example of the semiconductor device. However, the semiconductor device may be a combination of an IGBT and a diode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a first semiconductor region of a first conductivity type provided above the first electrode;
a second semiconductor region of a second conductivity type provided above the first semiconductor region, the second semiconductor region having a first impurity concentration;
a plurality of third semiconductor regions of the second conductivity type provided in a surface of the second semiconductor region, each of the third semiconductor regions having a second impurity concentration higher than the first impurity concentration;
a second electrode provided above the second semiconductor region and the third semiconductor regions; and
a first intermediate metal film provided between the second electrode and the second semiconductor region, wherein
a boundary between the first semiconductor region and the second semiconductor region is provided continuously through regions directly under the third semiconductor regions and protrudes below directly under the third semiconductor regions.

2. The device according to claim 1, wherein
a part of the first semiconductor region and a part of the second semiconductor region are alternating in a second direction, and
the second direction is perpendicular to a first direction that connects the first electrode and the second electrode.

3. The device according to claim 2, wherein the third semiconductor regions are arrayed in the second direction and separate from each other.

4. The device according to claim 1, wherein
the second electrode is in ohmic contact with the third semiconductor regions and
the first intermediate metal film forms Schottky junction with the second semiconductor region.

5. The device according to claim 1, wherein work function in a material of the first intermediate metal film is larger than work function in a material of the second electrode.

6. The device according to claim 1, wherein
the second electrode includes aluminum, and
the first intermediate metal film includes one of titanium and tungsten.

* * * * *